(12) United States Patent
Shen et al.

(10) Patent No.: US 11,682,736 B2
(45) Date of Patent: Jun. 20, 2023

(54) SEMICONDUCTOR DEVICE

(71) Applicant: Taiwan Semiconductor Manufacturing Company, Ltd., Hsinchu (TW)

(72) Inventors: Yu-Chun Shen, Tainan (TW); Chi-Chung Jen, Kaohsiung (TW); Ya-Chi Hung, Kaohsiung (TW); Yu-Chu Lin, Tainan (TW); Wen-Chih Chiang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/143,815

(22) Filed: Jan. 7, 2021

(65) Prior Publication Data

US 2022/0216343 A1    Jul. 7, 2022

(51) Int. Cl.

| | |
|---|---|
| *H10B 41/10* | (2023.01) |
| *H10B 41/30* | (2023.01) |
| *H01L 29/788* | (2006.01) |
| *H01L 27/11519* | (2017.01) |
| *H01L 29/66* | (2006.01) |
| *H01L 29/423* | (2006.01) |
| *H01L 21/28* | (2006.01) |
| *H01L 27/11521* | (2017.01) |

(52) U.S. Cl.
CPC .... *H01L 29/7887* (2013.01); *H01L 27/11519* (2013.01); *H01L 27/11521* (2013.01); *H01L 29/40114* (2019.08); *H01L 29/42328* (2013.01); *H01L 29/66825* (2013.01)

(58) Field of Classification Search
None
See application file for complete search history.

(56) References Cited

U.S. PATENT DOCUMENTS

| | | | | |
|---|---|---|---|---|
| 2013/0313626 | A1* | 11/2013 | Huang | H01L 29/7881 257/E27.06 |
| 2014/0015029 | A1* | 1/2014 | Hsu | H01L 29/42332 438/266 |
| 2014/0299571 | A1* | 10/2014 | Sawataishi | C23F 4/00 216/17 |
| 2020/0365700 | A1* | 11/2020 | Hsu | G11C 16/0433 |

\* cited by examiner

*Primary Examiner* — Xiaoming Liu
(74) *Attorney, Agent, or Firm* — Harrity & Harrity, LLP

(57) ABSTRACT

In some implementations, one or more semiconductor processing tools may deposit a first dielectric layer on a substrate of a semiconductor device. The one or more semiconductor processing tools may deposit a floating gate on the first dielectric layer. The one or more semiconductor processing tools may deposit a second dielectric layer on the floating gate and on the substrate of the semiconductor device. The one or more semiconductor processing tools may deposit a first control gate on a first portion of the second dielectric layer. The one or more semiconductor processing tools may deposit a second control gate on a second portion of the second dielectric layer, wherein a third portion of the second dielectric layer is between the first control gate and the floating gate and between the second control gate and the floating gate.

20 Claims, 13 Drawing Sheets

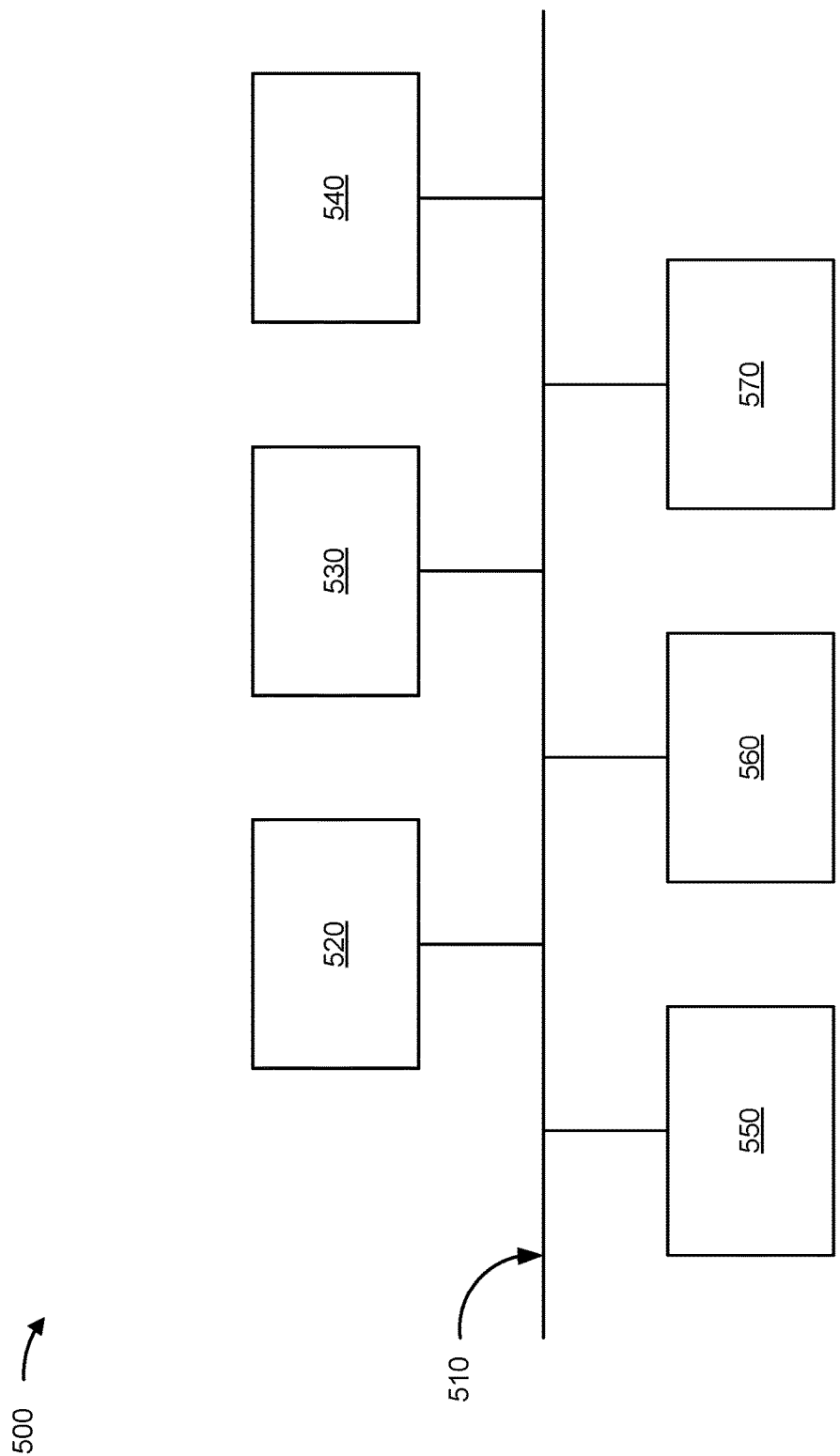

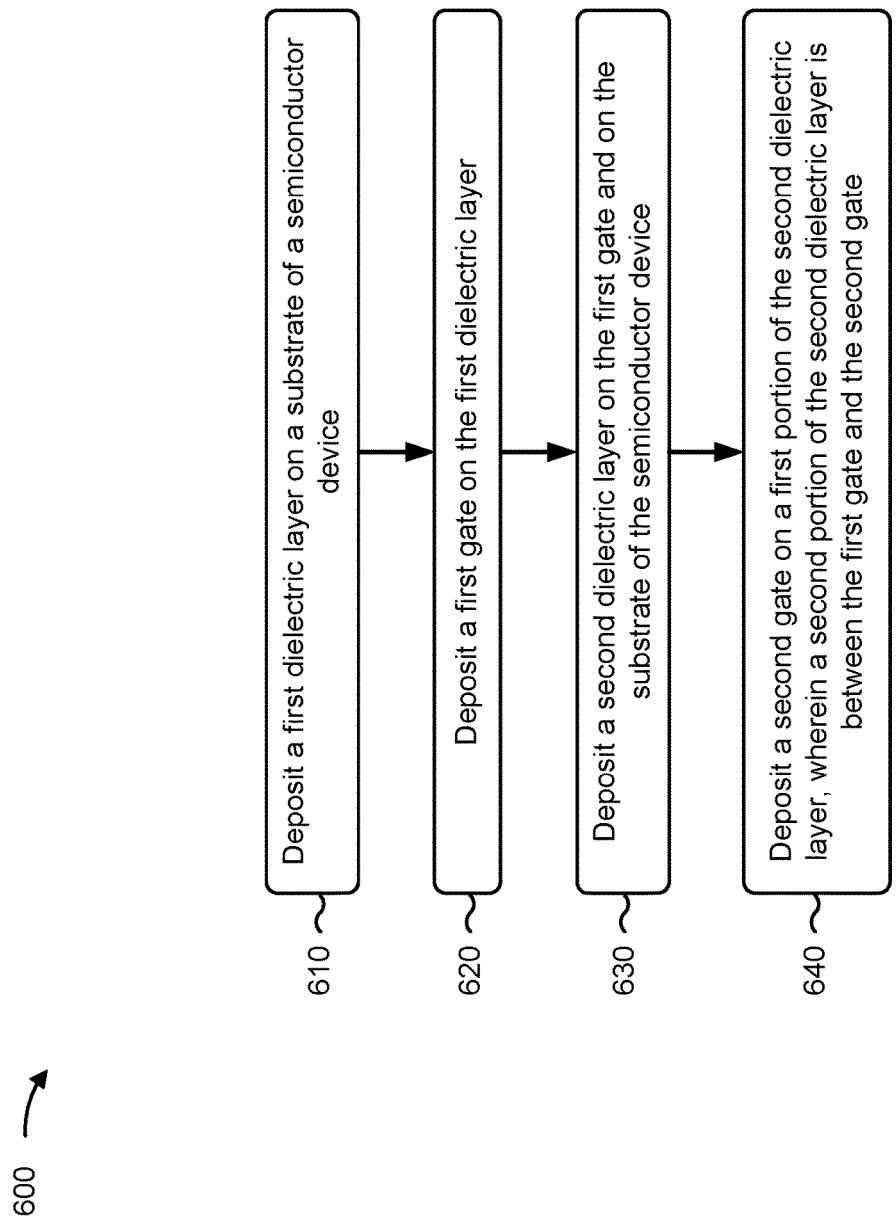

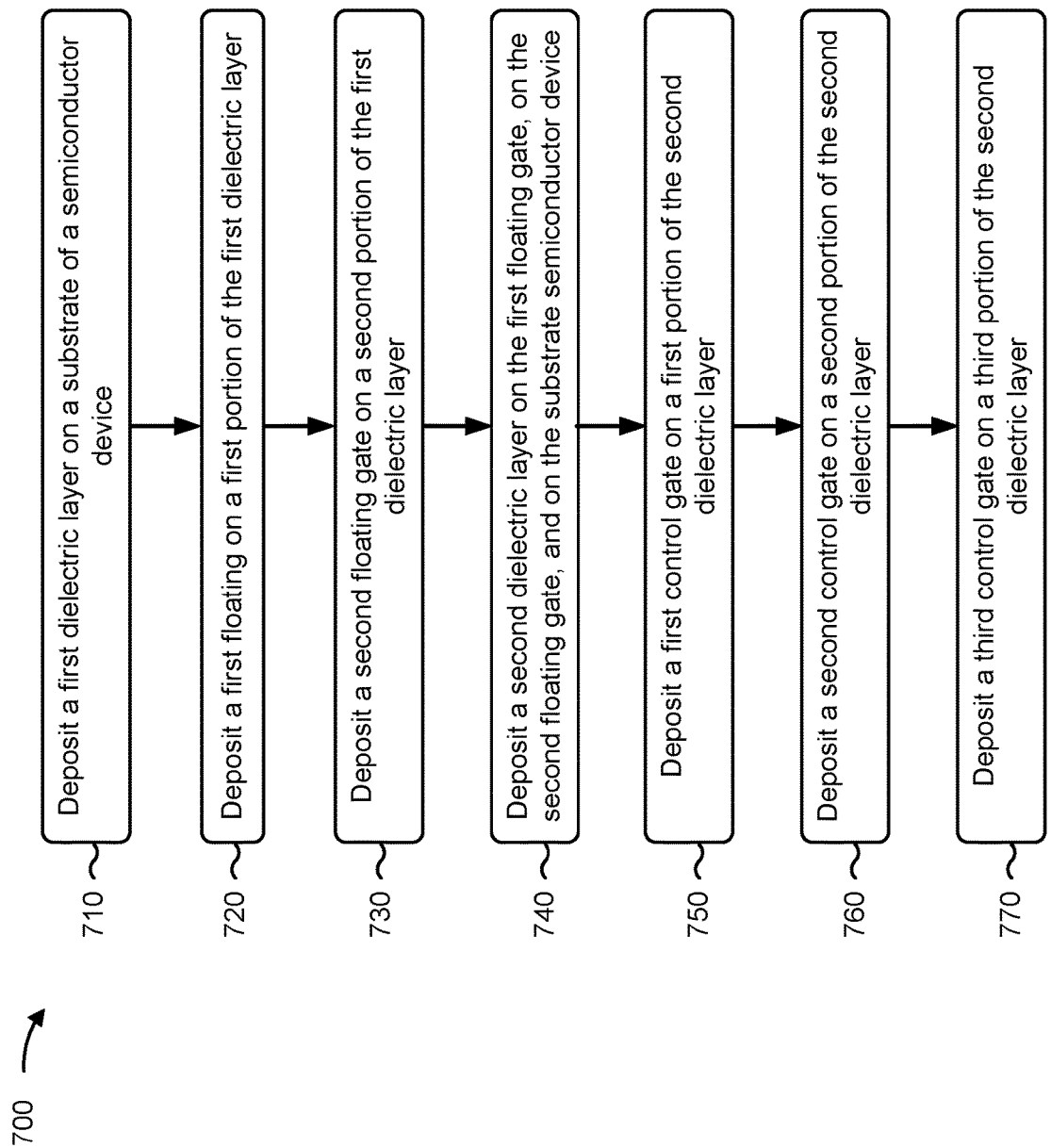

SEMICONDUCTOR DEVICE

BACKGROUND

A transistor is a common type of semiconductor device in electronic devices that is able to amplify and/or switch electrical signals. A transistor may be configured with three terminals to receive one or more applications of voltage. A voltage applied to a first terminal associated with a gate may control a current across a second terminal associated with a source voltage and a third terminal associated with a drain voltage.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a diagram of example components of one or more devices of FIG. 1.

FIGS. 6 and 7 are flowcharts of example processes relating to manufacturing a semiconductor device.

DETAILED DESCRIPTION

Figure 1:
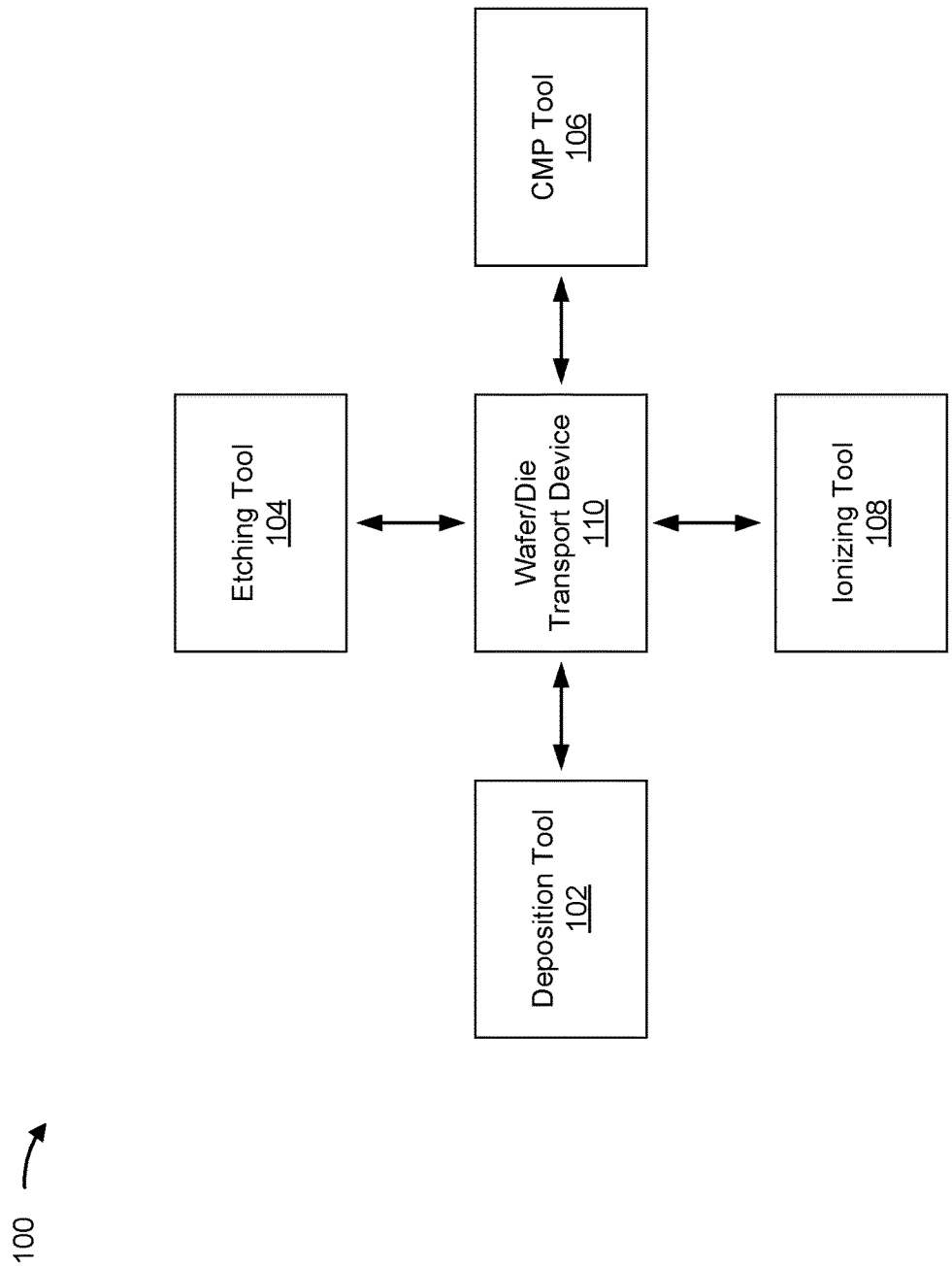
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor device may include a control gate and a floating gate, in a stacked configuration, on a substrate of the semiconductor device. Based on the control gate being stacked on the floating gate, the control gate may be relatively close to an electrode that is coupled to a source or drain (hereinafter "source/drain") terminal the semiconductor device. Based on proximity of the control gate to the electrode, a dielectric material (e.g., an interlayer dielectric material), that is configured to insulate the electrode from the control gate, may deteriorate. Deterioration of the dielectric material may result in a short between the electrode and the control gate. Additionally, some processes for manufacturing the semiconductor devices in the stacked configuration may include operations for forming gates that include depositing polysilicon material multiple times (e.g., 3 times), applying photoresist to the polysilicon material multiple times (e.g., 2 times), and performing etching on the polysilicon material multiple times (e.g., 3 times) to form a floating gate, a control gate, and a select gate. The process may provide challenges, such as multi-layer photo alignment to reduce a likelihood of shorting between a gate and a terminal and/or an electrode for a source/drain.

Some implementations described herein provide techniques and apparatuses for manufacturing a semiconductor device. A semiconductor device may include a first control gate and a second control gate, with a floating gate and a dielectric material between the first control gate and the second control gate. Based on the first control gate, the second control gate, and the floating gate being arranged laterally (e.g., instead of being arranged in a stacked configuration) the first control gate and the second control gate may be relatively far from an electrode that is coupled to a source/drain of the semiconductor device. Additionally, a process for manufacturing the semiconductor device may include operations for forming gates that include depositing polysilicon material a reduced number of times (e.g., 2 times), applying photoresist a reduced number of times (e.g., 1 time), and performing etching on the polysilicon material a reduced number of times (e.g., 2 times) to form a floating gate, a first control gate, and a second control gate. This may reduce a manufacturing time, a manufacturing cost, and defects from the manufacturing process.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a chemical-mechanical polishing (CMP) tool, and/or an ionizing tool 108. The plurality of semiconductor processing tools 102-108 included in example environment 100 may be included in a semiconductor clean room, a semiconductor foundry, a semiconductor foundry, a semiconductor processing and/or manufacturing facility, and/or the like.

Deposition tool 102 is a semiconductor processing tool that is capable of depositing various types of materials onto a substrate. In some implementations, deposition tool 102 includes a spin coating tool that is capable of depositing a photoresist layer on a substrate such as a wafer. In some implementations, deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, deposition tool 102 includes a physical vapor deposition (PVD) tool, such as a sputtering tool or another type of PVD tool. In some implementations, the example environment 100 includes a plurality of types of deposition tools 102.

Etching tool 104 is a semiconductor processing tool that is capable of etching various types of materials of a substrate, wafer, or semiconductor device. For example, etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a the substrate using a sputtering technique, a plasma-assisted etch technique (e.g., a plasma sputtering technique or another type of technique involving the use of an ionized gas to isotopically or directionally etch the one or more portions), or another type of dry etching technique.

CMP tool 106 is a semiconductor processing tool that is capable of polishing or planarizing various layers of a wafer or semiconductor device. For example, CMP tool 106 may be configured to polish or planarize a layer or surface of deposited or plated material. CMP tool 106 may polish or planarize a surface of a semiconductor device with a combination of chemical and mechanical forces (e.g., chemical etching and free abrasive polishing). CMP tool 106 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

Ionizing tool 108 is a semiconductor processing tool that is capable of being used to implant ions into a substrate such as a semiconductor wafer. Ionizing tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMES), and/or another type of tool that is used to transport wafers and/or dies between semiconductor processing tools 102-108 and/or to and from other locations such as a wafer rack, a storage room, and/or the like. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

FIGS. 2A-2L are diagrams of one or more example implementations described herein. Example implementation(s) may include one or more example implementations of a process for manufacturing a semiconductor device 200 (e.g., a transistor), as described herein. In some implementations, example implementation(s) may include a process of depositing a first dielectric layer (e.g., a tunneling oxide layer) on a substrate of the semiconductor device, depositing a floating gate on the first dielectric layer, and depositing a second dielectric layer (e.g., an oxide-nitride-oxide dielectric layer) on the floating gate and on the substrate. The processes may further include depositing a first control gate on a first portion of the second dielectric layer that is on the substrate and depositing a second control gate on a second portion of the second dielectric layer, with a third portion of the second dielectric layer between the first control gate and the floating gate and between the second control gate and the floating gate. In other words, the first control gate, the floating gate, and the second control gate are arranged laterally with the second dielectric layer between them. In this way, the first control gate and the second control gate may be relatively far from an electrode that is coupled to a source/drain of the semiconductor device, which may reduce defects from the manufacturing process. Additionally, the manufacturing process may have a reduced manufacturing time and a reduced manufacturing cost.

Figure 2A:
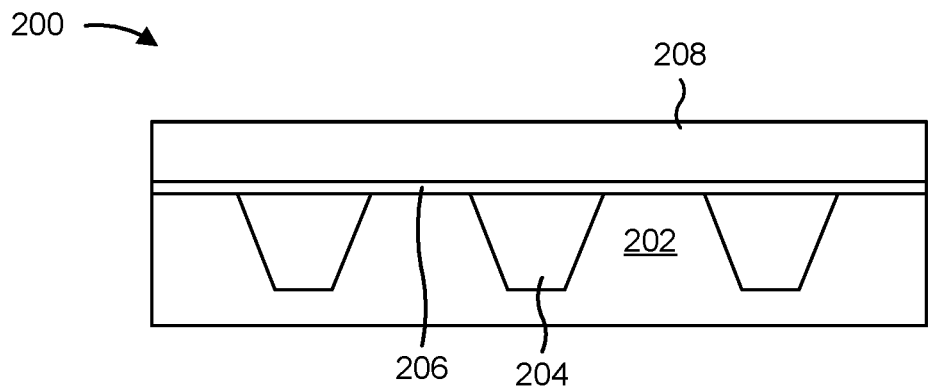
FIGS. 2A-2L are diagrams illustrating a sequence of operations for manufacturing a semiconductor device, as described herein.
Figure 2B:
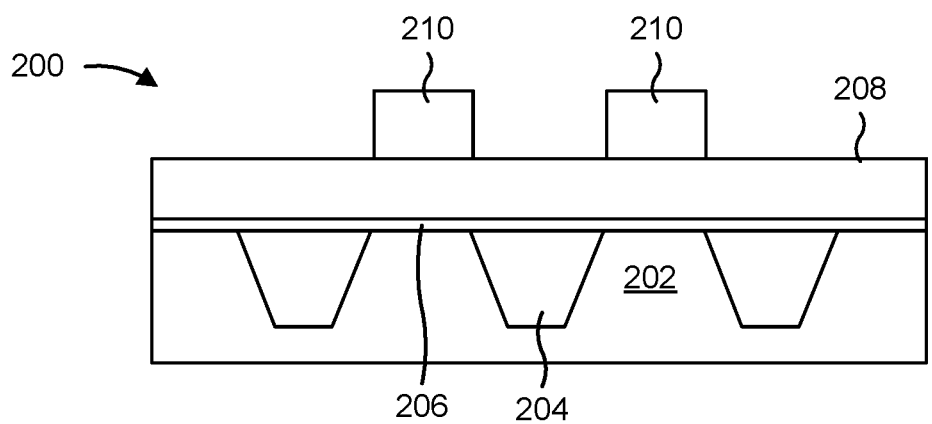
Figure 2C:
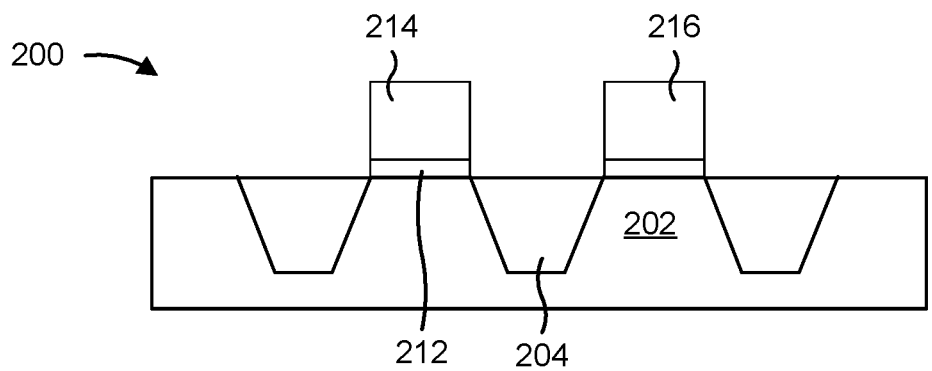

FIGS. 2A-2C show the semiconductor device 200 from a first side view. FIGS. 2D-2L show the semiconductor device 200 from a second side view that is generally orthogonal to the first side view.

As shown in FIG. 2A, the semiconductor device 200 may include a substrate 202, trench isolation material 204 embedded in the substrate 202, a first dielectric material 206 disposed on the substrate 202 and floating gate material 208 on the first dielectric material 206. In some implementations, the substrate 202 may include a silicon-based material. In some implementations, the trench isolation material 204 includes one or more dielectric materials (e.g., silicon dioxide). In some implementations, the first dielectric material 206 may include an oxide-based material configured for tunneling (e.g., a tunneling oxide) during an operation of the semiconductor device 200. In some implementations, the floating gate material 208 may include a polysilicon-based material.

In some implementations, an etching tool (e.g., etching tool 104) may etch a portion of the substrate 202 to form one or more shallow trenches. In some implementations, a deposition tool (e.g., deposition tool 102) may deposit the trench isolation material 204 into the one or more shallow trenches to provide shallow trench isolation (STI) to isolate surfaces of the substrate 202. In some implementations, the deposition tool may use chemical vapor deposition or physical vapor deposition, among other examples, to deposit the trench isolation material 204 into the one or more shallow trenches of the substrate 202. In some implementations, a CMP tool (e.g., CMP tool 106) may planarize an upper surface of the substrate 202 and/or the trench isolation material 204.

In some implementations, a deposition tool (e.g., deposition tool 102) may deposit the first dielectric material 206 on the substrate 202 and/or the trench isolation material 204. In some implementations, the deposition tool may use chemical vapor deposition or physical vapor deposition, among other examples, to deposit the first dielectric material 206 on the substrate 202 and/or the trench isolation material 204. In some implementations, a CMP tool (e.g., CMP tool 106) may planarize an upper surface of the first dielectric material 206.

In some implementations, a deposition tool (e.g., deposition tool 102) may deposit the floating gate material 208 on the first dielectric material 206. In some implementations, the deposition tool may use chemical vapor deposition or physical vapor deposition, among other examples, to deposit the floating gate material 208 on the first dielectric material 206. In some implementations, a CMP tool (e.g., CMP tool 106) may planarize an upper surface of the floating gate material 208.

As shown in FIG. 2B, a deposition tool (e.g., deposition tool 102) may deposit a photoresist 210 on the floating gate material 208. In some implementations, the deposition tool may use chemical vapor deposition or physical vapor deposition, among other examples, to deposit the photoresist 210 on the floating gate material 208. In some implementations, the deposition tool may deposit the photoresist 210 on multiple portions of the floating gate material 208. For example, the deposition tool may deposit the photoresist 210 on portions of the floating gate material 208 to be formed into floating gates.

As shown in FIG. 2C, an etching tool (e.g., etching tool 104) may etch one or more portions of the first dielectric material 206 and the floating gate material 208 (e.g., one or more portions without the photoresist 210) to form a first dielectric layer 212 and one or more floating gates (e.g., a first floating gate 214 of one or more transistor components of the semiconductor device, among other examples). Each floating gate may be formed on a portion of the first dielectric layer 212. In some implementations, the first dielectric layer 212 and the one or more floating gates may generally extend between adjacent portions of the trench isolation material 204.

Figure 2D:
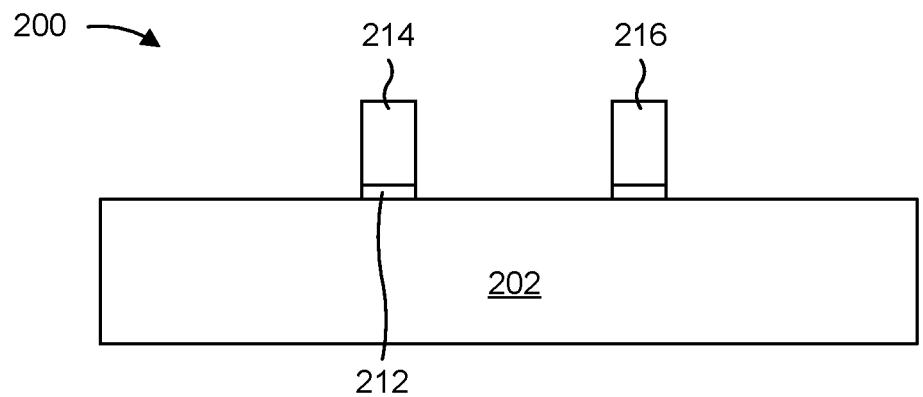

As shown in FIG. 2D, the first floating gate 214 and a second floating gate 216 may be formed on separate portions of the first dielectric layer 212 without trench isolation material 204 between the first floating gate 214 and the second floating gate 216.

Figure 2E:
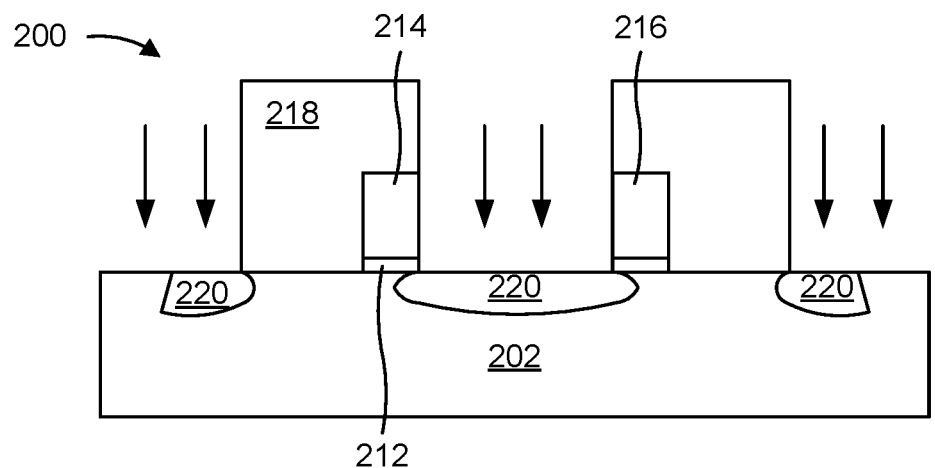

As shown in FIG. 2E, a deposition tool (e.g., deposition tool 102) may deposit a photoresist 218 on the first floating gate 214, the second floating gate 216, and/or one or more portions of the substrate 202. In some implementations, the deposition tool may use chemical vapor deposition or physical vapor deposition, among other examples, to deposit the photoresist 210 on the floating gate material 208.

In some implementations, the ionizing tool 108 may implant ions into the substrate 202 via a plasma that contains the ions. The ionizing tool 108 may extract the ions from the plasma and accelerate the ions to form an ion beam directed toward the substrate 202. The ionizing tool 108 may form one or more source/drains 220 in the substrate 202 as ionized portions of the substrate 202.

Figure 2F:
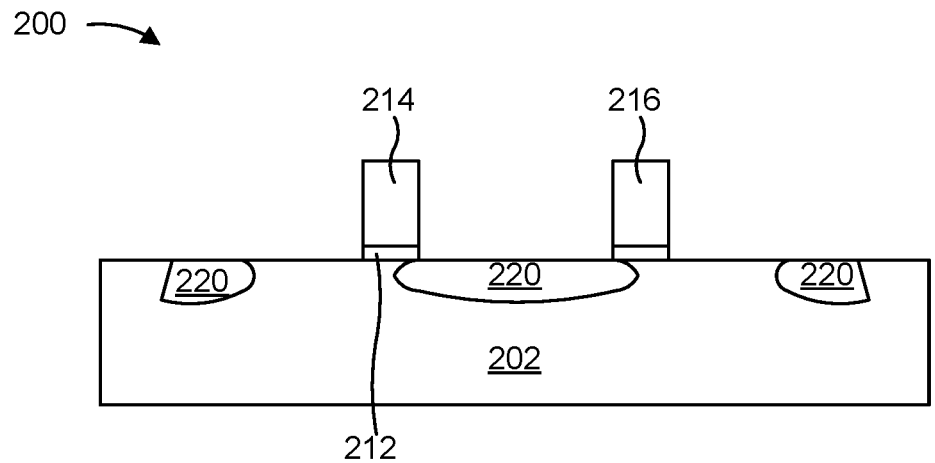

As shown in FIG. 2F, an etching tool (e.g., etching tool 104) may etch away the photoresist 218 after forming the one or more source/drains 220 in the substrate 202. In some implementations, after etching away the photoresist 218, the substrate 202 may include multiple portions including one or more source/drains, one or more portions that are exposed, and one or more portions under floating gates (e.g., the first floating gate 214 and/or the second floating gate 216 and/or one or more portions of the first dielectric layer 212).

Figure 2G:
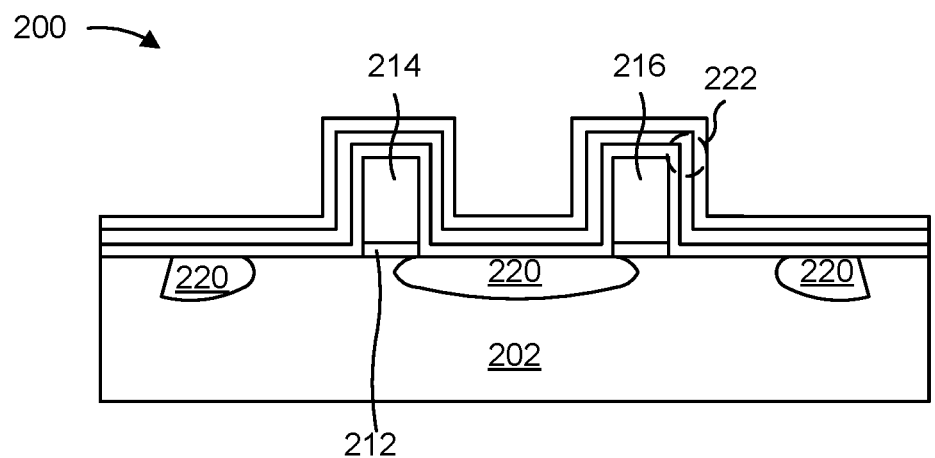

As shown in FIG. 2G, a deposition tool (e.g., deposition tool 102) may deposit a second dielectric layer 222 on the semiconductor device 200 (e.g., on the substrate 202, the first floating gate 214, and/or the second floating gate 216, among other examples). In some implementations, the deposition tool may use chemical vapor deposition or physical vapor deposition, among other examples, to deposit the second dielectric layer 222 on the semiconductor device 200. In some implementations, the deposition tool may deposit the second dielectric layer 222 in multiple operations. For example, the deposition tool may deposit the second dielectric layer 222 based on a first deposition of a first oxide-based layer, a second deposition of a nitride-based layer, and a third deposition of a second oxide-based layer to form an oxide-nitride-oxide structure as at least a portion of the second dielectric layer 222.

In some implementations, the second dielectric layer 222 may include a first portion that is laterally displaced from the first floating gate 214 and on the substrate 202 (e.g., shown to the left of the first floating gate 214), a second portion that is laterally displaced from the first floating gate 214 (e.g., between the first floating gate 214 and the second floating gate 216) and on the substrate 202, and a third portion that is on the first floating gate 214 (e.g., on an upper surface and/or on one or more side surfaces of the first floating gate 214). In some implementations, the second dielectric layer 222 may include a fourth portion that is laterally displaced from the second floating gate 216 and on the substrate 202 (e.g., shown to the right of the second floating gate 216), and a fifth portion that is on the second floating gate 216 (e.g., on an upper surface and/or on one or more side surfaces of the second floating gate 216).

Figure 2H:
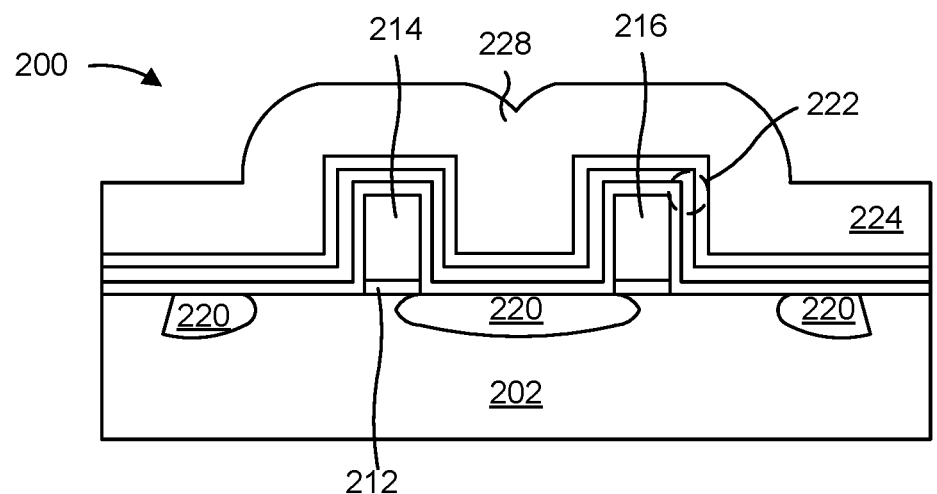

As shown in FIG. 2H, a deposition tool (e.g., deposition tool 102) may deposit control gate material 224 on the second dielectric layer 222. In some implementations, the deposition tool may use chemical vapor deposition or physical vapor deposition, among other examples, to deposit the control gate material 224 on the second dielectric layer 222. In some implementations, the control gate material 224 may include one or more portions with different thicknesses (e.g., based on a deposition process and contours of the second dielectric layer 222). For example, the control gate material 224 may have relatively large thicknesses between the first floating gate 214 and the second floating gate 216 (e.g., on the second portion of the second dielectric layer 222), adjacent to the first floating gate 214 (e.g., on the first portion of the second dielectric layer 222), and/or adjacent to the second floating gate 216 (e.g., on the fourth portion of the second dielectric layer 222), among other examples. The control gate material 224 may have relatively small thicknesses on the first floating gate 214, on the second floating gate 216, and/or on one or more portions of the second dielectric layer 222 that are not adjacent to the first floating gate 214 or the second floating gate 216 (e.g., above source/drains 220 that are not between the first floating gate 214 and the second floating gate 216).

Figure 2I:
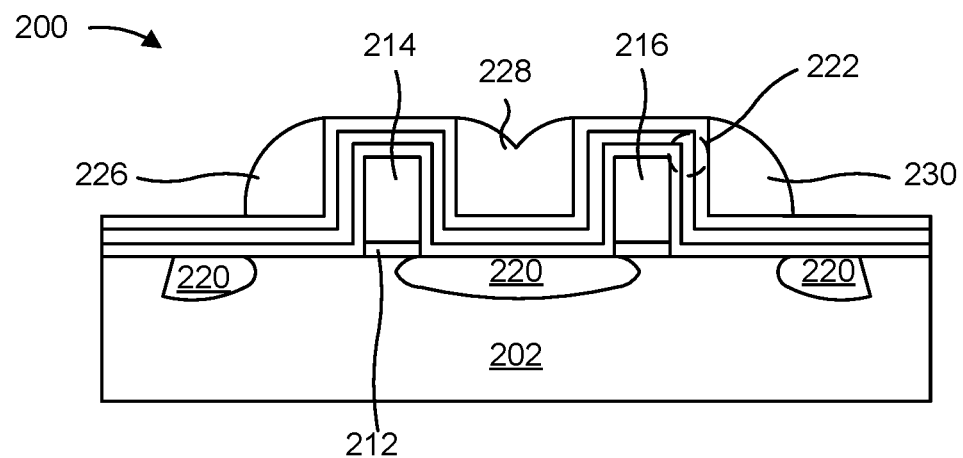

As shown in FIG. 2I, an etching tool (e.g., etching tool 104) may etch away portions of the control gate material 224 to form a first control gate 226, a second control gate 228, and/or a third control gate 230. In some implementations, the first control gate 226, the second control gate 228, and/or the third control gate 230 may be formed based on the first control gate 226, the second control gate 228, and/or the third control gate 230 having relatively large thicknesses of the control gate material 224. The first control gate 226 may be formed on the second dielectric layer 222 (e.g., on the first portion of the second dielectric layer 222) in a position that is laterally displaced from the first floating gate 214 (e.g., to a side of the first floating gate 214). The second control gate 228 may be formed on the second dielectric layer 222 (e.g., on the second portion of the second dielectric layer 222) in a position that is laterally displaced from the first floating gate 214 and/or between the first floating gate 214 and the second floating gate 216. The third control gate 230 may be formed on the second dielectric layer 222 (e.g., on the fourth portion of the second dielectric layer 222) in a position that is laterally displaced from the second floating gate 216.

Figure 2J:
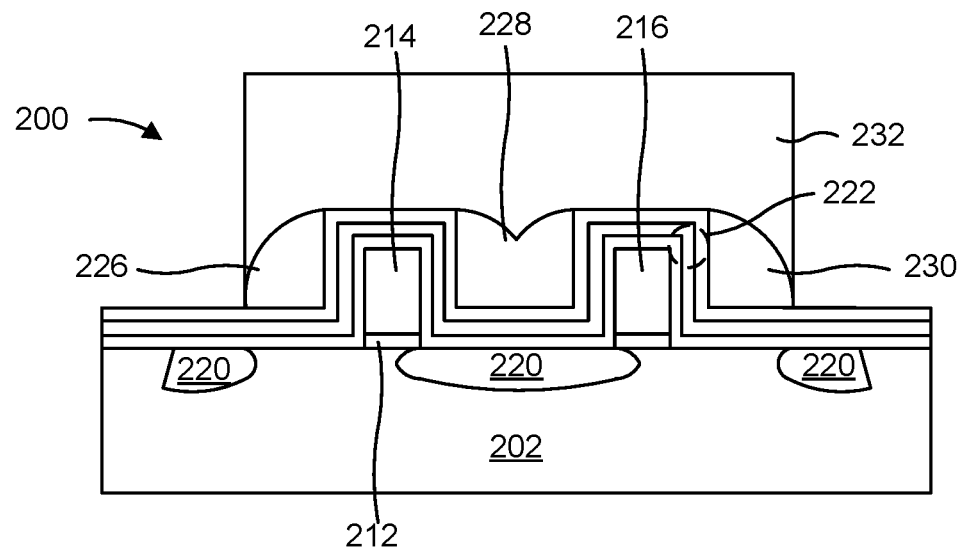

As shown in FIG. 2J, a deposition tool (e.g., deposition tool 102) may deposit a photoresist 218 on the first control gate 226, the second control gate 228, the third control gate 230, and/or one or more portions of the second dielectric layer 222. In some implementations, the deposition tool may not deposit the photoresist 218 on portions of the second dielectric layer 222 that are above one or more source/drains 220 of the semiconductor device 200. In some implementations, the deposition tool may use chemical vapor deposition or physical vapor deposition, among other examples, to deposit the photoresist 210 on the floating gate material 208.

Figure 2K:
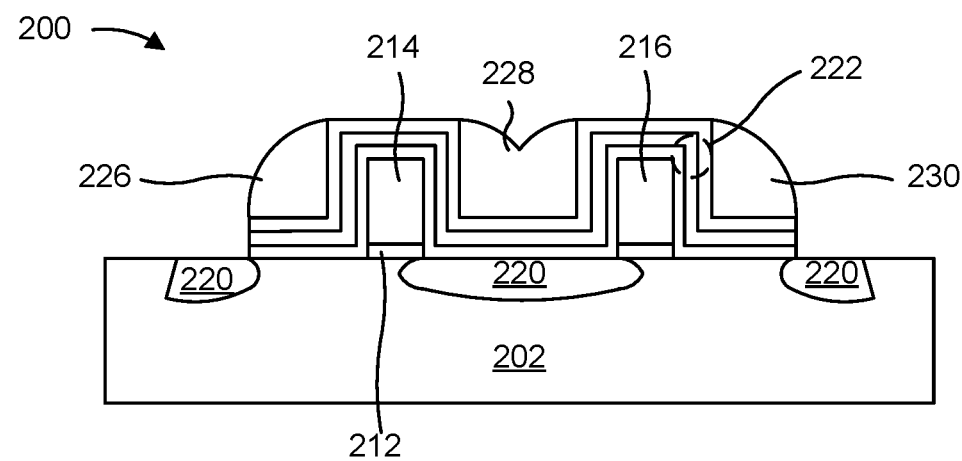

As shown in FIG. 2K, an etching tool (e.g., etching tool 104) may etch away one or more portions of the second dielectric layer 222 that do not have the photoresist 218. In some implementations, after etching away the one or more portions of the second dielectric layer 222, one or more source/drains 220 of the semiconductor device 200 may be exposed. In some implementations, after etching away the one or more portions of the second dielectric layer 222, the etching tool may etch away the photoresist 210 from the first control gate 226, the second control gate 228, the third control gate 230, and/or one or more portions of the second dielectric layer 222.

Figure 2L:
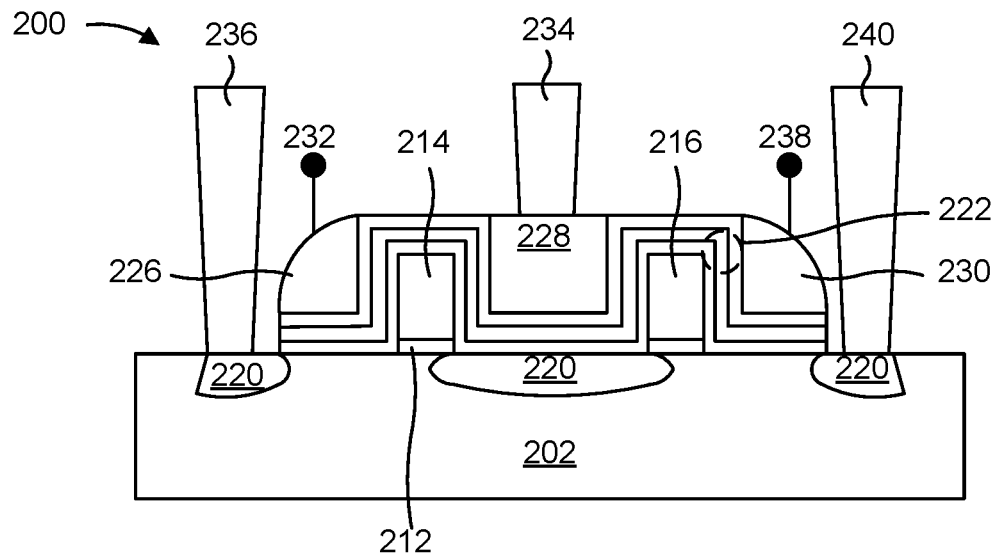

As shown in FIG. 2L, a deposition tool (e.g., deposition tool 102) may deposit a first terminal 232 on the first control gate 226, a second terminal 234 on the second control gate 228, and/or a third terminal 236 on a portion of the substrate 202 that is configured as a source/drain for the semiconductor device 200. In some implementations, the deposition tool may deposit a fourth terminal 238 on the third control gate 230 and/or a fifth terminal 240 on a portion of the substrate 202 that is configured as a source/drain for the semiconductor device 200. In some implementations, the deposition tool may use chemical vapor deposition or physical vapor deposition, among other examples, to deposit the first terminal 232, the second terminal 234, the third terminal 236, the fourth terminal 238, and/or the fifth terminal 240.

Based on the first control gate, the second control gate, and the floating gate being arranged laterally (e.g., instead of being arranged in a stacked configuration), the first control gate and the second control gate may be displaced from an electrode and/or a terminal that is coupled to a source/drain of the semiconductor device, with a relatively far displacement. Additionally, a process for manufacturing the semiconductor device 200 may include operations for forming gates that include depositing polysilicon material 2 times, applying photoresist 1 time, and performing etching on the polysilicon material 2 times to form a floating gate, a first control gate, and a second control gate. This may reduce a manufacturing time, manufacturing cost, and may reduce defects from the manufacturing process.

As indicated above, FIGS. 2A-2L are provided as an example. Other examples may differ from what is described with regard to FIGS. 2A-2L. The number and arrangement of devices shown in FIGS. 2A-2L are provided as an example. In practice, there may be additional devices, fewer devices, different devices, or differently arranged devices than those shown in FIGS. 2A-2L. Furthermore, two or more devices shown in FIGS. 2A-2L may be implemented within a single device, or a single device shown in FIGS. 2A-2L may be implemented as multiple, distributed devices. Additionally, or alternatively, a set of devices (e.g., one or more devices) shown in FIGS. 2A-2L may perform one or more functions described as being performed by another set of devices shown in FIGS. 2A-2L.

Figure 3:
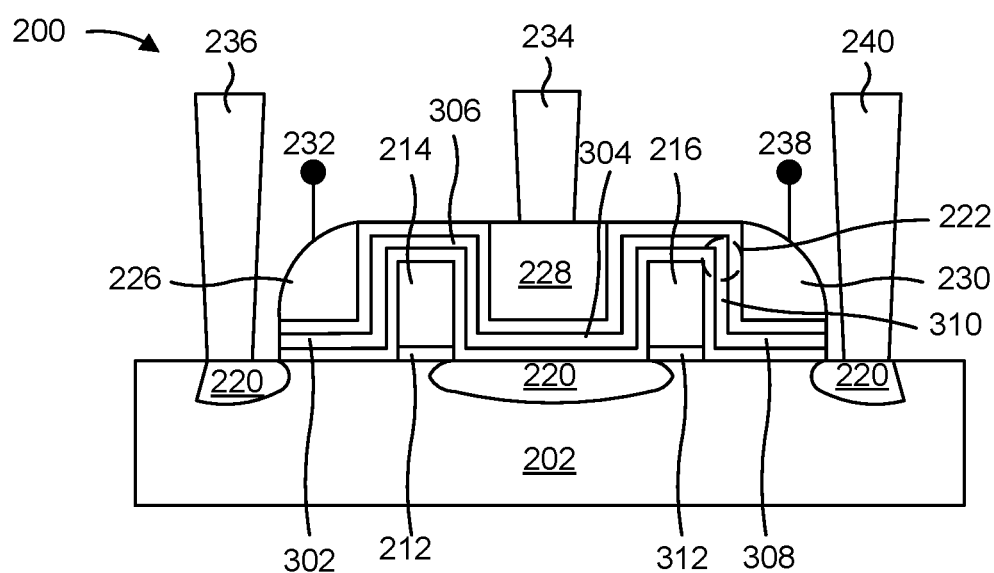
FIG. 3 is a diagram of an example semiconductor device formed based on the example techniques described in connection with FIGS. 2A-2L.

FIG. 3 is a diagram of a semiconductor device 200 formed based on the example techniques described in connection with FIGS. 2A-2L. In some implementations, the semiconductor device 200 may include a transistor.

As shown in FIG. 3, the semiconductor device 200 may include a substrate 202, a first dielectric layer 212, a first floating gate 214, a second floating gate 216, one or more source/drains 220, a second dielectric layer 222, a first control gate 226, a second control gate 228, and/or a third control gate 230. The semiconductor device 200 may be coupled to one or more voltage sources and/or ground using a first terminal 232, a second terminal 234, a third terminal 236, a fourth terminal 238, and/or a fifth terminal 240, among other examples.

As further shown in FIG. 3, the second dielectric layer 222 may include a first portion 302 below the first control gate 226 and laterally displaced from the first floating gate 214. The second dielectric layer 222 may include a second portion 304 below the second control gate 228 and laterally displaced from the first floating gate 214 (e.g., between the first floating gate 214 and the second floating gate 216 and/or above a source/drain of the semiconductor device 200). The second dielectric layer 222 may include a third portion 306 on the first floating gate 214, between the first floating gate 214 and the first control gate 226, and between the first floating gate 214 and the second control gate 228. The second dielectric layer 222 may include a fourth portion 308 below the third control gate 230 and laterally displaced from the second floating gate 216. The second dielectric layer 222 may include a fifth portion 310 on the second floating gate 216, between the second floating gate 216 and the second control gate 228, and between the second floating gate 216 and the third control gate 230.

In some implementations, the semiconductor device 200 has a first state associated with the first control gate 226, the second control gate 228, and a first portion of the substrate (e.g., a portion of the substrate 202 that is configured as a source/drain and is coupled to the third terminal 236). In some implementations, the semiconductor device 200 has a second state associated with the third control gate 230, the second control gate 228, and a third portion of the substrate of the semiconductor device (e.g., a portion of the substrate 202 that is configured as a source/drain and is coupled to the fifth terminal 240).

In some implementations, the semiconductor device 200 may be configured to perform a programming operation (e.g., associated with a first side of the semiconductor device 200) based on application of a first voltage (e.g., approximately 5 volts) to the first control gate 226; application of a second voltage (e.g., approximately 11 volts), that is greater than the first voltage, to the second control gate 228; and application of a third voltage (e.g., approximately −4 volts), that is less than the first voltage, to a portion of the substrate 202 that is configured as a source/drain and is coupled to the third terminal 236.

In some implementations, the semiconductor device 200 may be configured to perform a reading operation (e.g., associated with the first side of the semiconductor device 200) based on application of a first voltage (e.g., approximately 3 volts) to the first control gate 226; application of a second voltage (e.g., approximately 5 volts), that is greater than the first voltage, to the second control gate 228; and application of a third voltage (e.g., approximately −2 volts), that is less than the first voltage, to the portion of the substrate 202 that is configured as a source/drain and is coupled to the third terminal 236.

In some implementations, the semiconductor device 200 may be configured to perform an erasing operation (e.g., associated with the first side of the semiconductor device 200) based on application of a first voltage (e.g., approximately −5 volts) to the first control gate 226; application of a second voltage (e.g., approximately −11 volts), that is less than the first voltage, to the second control gate 228; and application of a third voltage (e.g., approximately 4 volts), that is greater than the first voltage, to the portion of the substrate 202 that is configured as a source/drain and is coupled to the third terminal 236.

In some implementations, the semiconductor device 200 may be configured to perform a programming operation (e.g., associated with a second side of the semiconductor device 200) based on application of a first voltage (e.g., approximately 5 volts) to the third control gate 230; application of a second voltage (e.g., approximately 11 volts), that is greater than the first voltage, to the second control gate 228; and application of a third voltage (e.g., approximately −4 volts), that is less than the first voltage, to the portion of the substrate 202 that is configured as a source/drain and is coupled to the fifth terminal 240.

In some implementations, the semiconductor device 200 may be configured to perform a reading operation (e.g., associated with the second side of the semiconductor device 200) based on application of a first voltage (e.g., approximately 3 volts) to the third control gate 230; application of a second voltage (e.g., approximately 5 volts), that is greater than the first voltage, to the second control gate 228; and application of a third voltage (e.g., approximately −2 volts), that is less than the first voltage, to the portion of the substrate 202 that is configured as a source/drain and is coupled to the fifth terminal 240.

In some implementations, the semiconductor device 200 may be configured to perform an erasing operation (e.g., associated with the second side of the semiconductor device 200) based on application of a first voltage (e.g., approximately −5 volts) to the third control gate 230; application of a second voltage (e.g., approximately −11 volts), that is less than the first voltage, to the second control gate 228; and application of a third voltage (e.g., approximately 4 volts), that is greater than the first voltage, to the portion of the substrate 202 that is configured as a source/drain and is coupled to the fifth terminal 240.

As indicated above, FIG. 3 is provided as an example. Other examples may differ from what is described with regard to FIG. 3.

FIGS. 4A-4D are diagrams of examples of a semiconductor device 400 formed based on the example techniques described in connection with FIGS. 2A-2L. As shown in FIGS. 4A-4D, the semiconductor device 200 may include, one or more source/drains 220, a third portion 305 of a second dielectric layer 222, a fifth portion 310 of the second dielectric layer 222, a first control gate 226, a second control gate 228, and/or a third control gate 230. The semiconductor device 400 may be coupled to one or more voltage sources and/or ground using a first terminal 232, a second terminal 234, a third terminal 236, a fourth terminal 238, and/or a fifth terminal 240, among other examples.

Figure 4A:
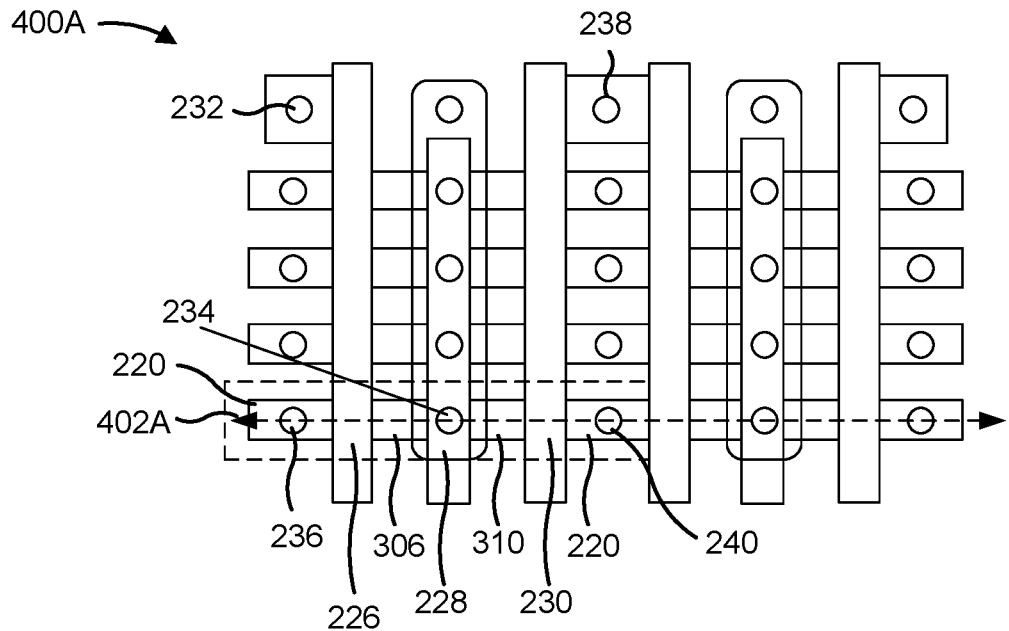
FIGS. 4A-4D are diagrams of examples of a semiconductor device formed based on the example techniques described in connection with FIGS. 2A-2L.

As shown in FIG. 4A, the semiconductor device 400A may include a first set of transistors including a multi-state transistor 402A. The multi-state transistor 402A may include one or more components of the semiconductor device 200 shown in FIG. 3. In some implementations, the first terminal 232 may be common with one or more of the set of transistors. In some implementations, the fourth terminal 238 may be common with one or more of the set of transistors. In some implementations, the fifth terminal 240 may be common with an adjacent transistor (e.g., shown on the right side of the semiconductor device 400).

Figure 4B:
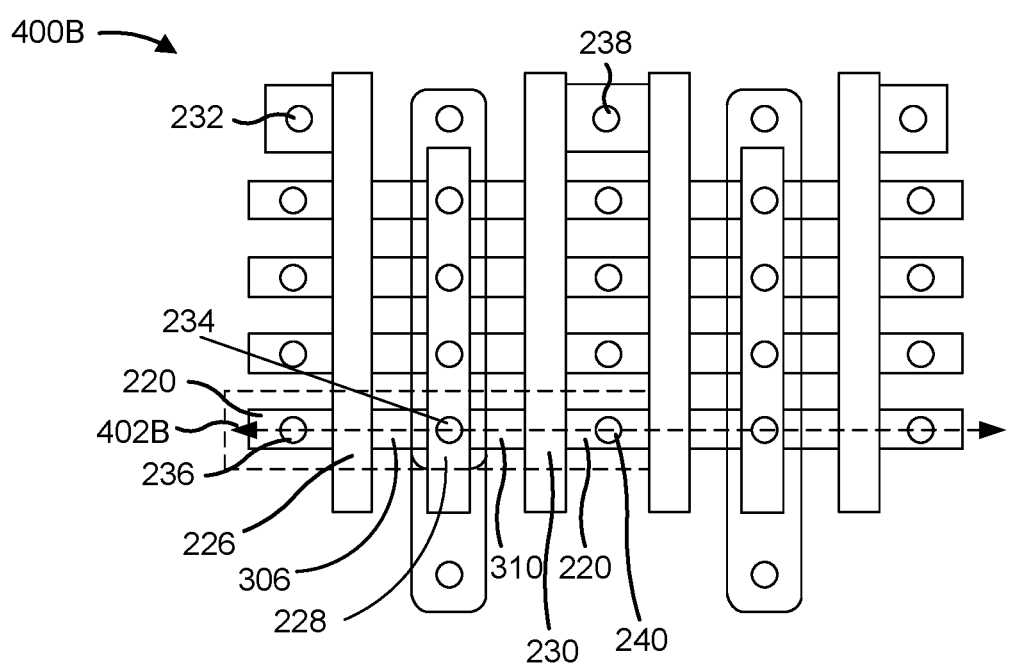

As shown in FIG. 4B, the semiconductor device 400B may include a first set of transistors including a multi-state transistor 402B. The multi-state transistor 402B may include one or more components of the semiconductor device 200 shown in FIG. 3. In some implementations, the first terminal 232 may be common with one or more of the set of transistors. In some implementations, the second terminal 234 may be common with one or more of the set of transistors via an underlaid connection. In some implementations, the fourth terminal 238 may be common with one or more of the set of transistors. In some implementations, the fifth terminal 240 may be common with an adjacent transistor.

Figure 4C:
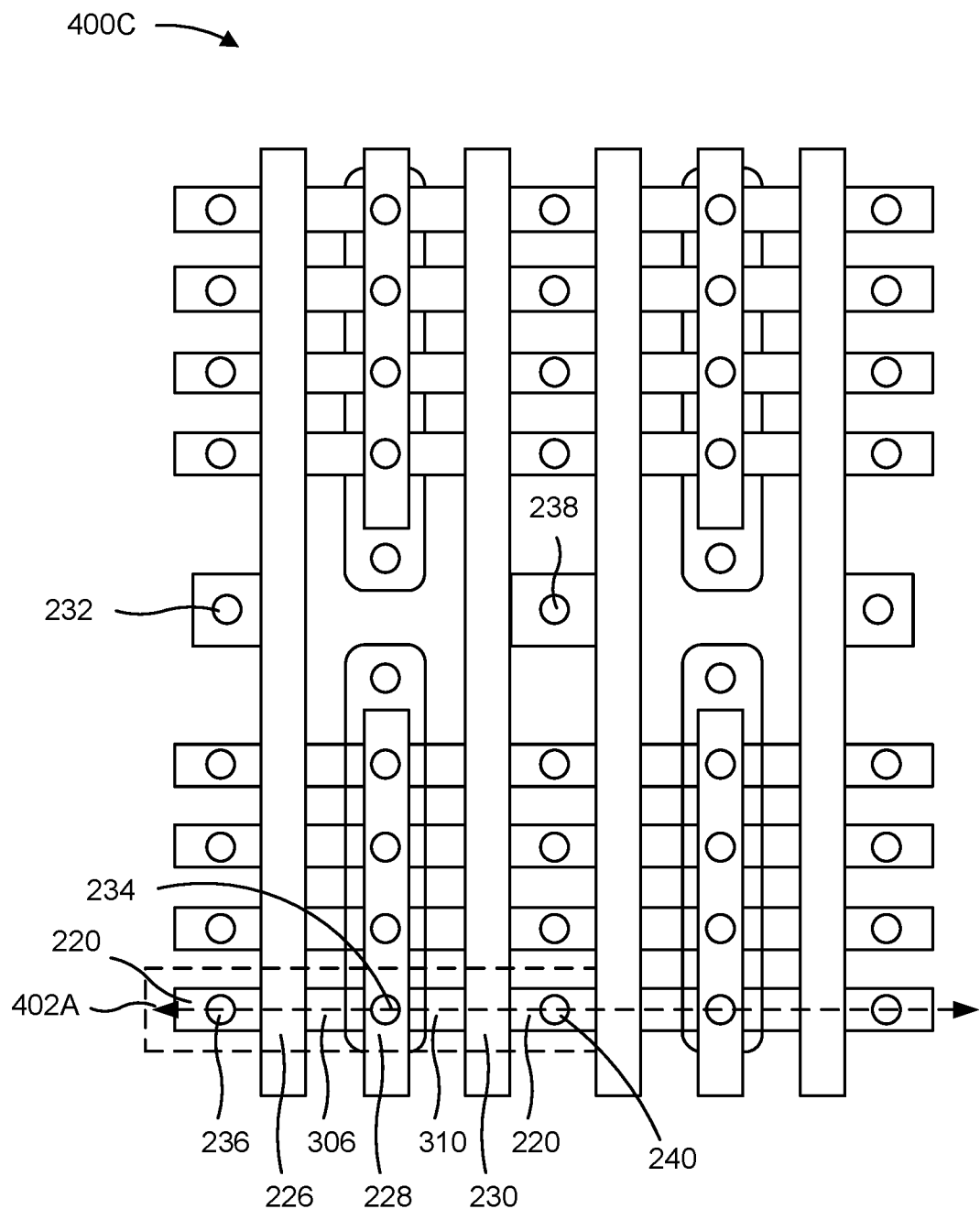

As shown in FIG. 4C, the semiconductor device 400C may include a first set of transistors coupled to a second set of transistors. The first set of transistors include a multi-state transistor 402C. The multi-state transistor 402C may include one or more components of the semiconductor device 200 shown in FIG. 3. In some implementations, the first terminal 232 may be common with the first set of transistors and the second set transistors. In some implementations, the fourth terminal 238 may be common with the first set of transistors and the second set of transistors and may be common between adjacent transistors.

Figure 4D:
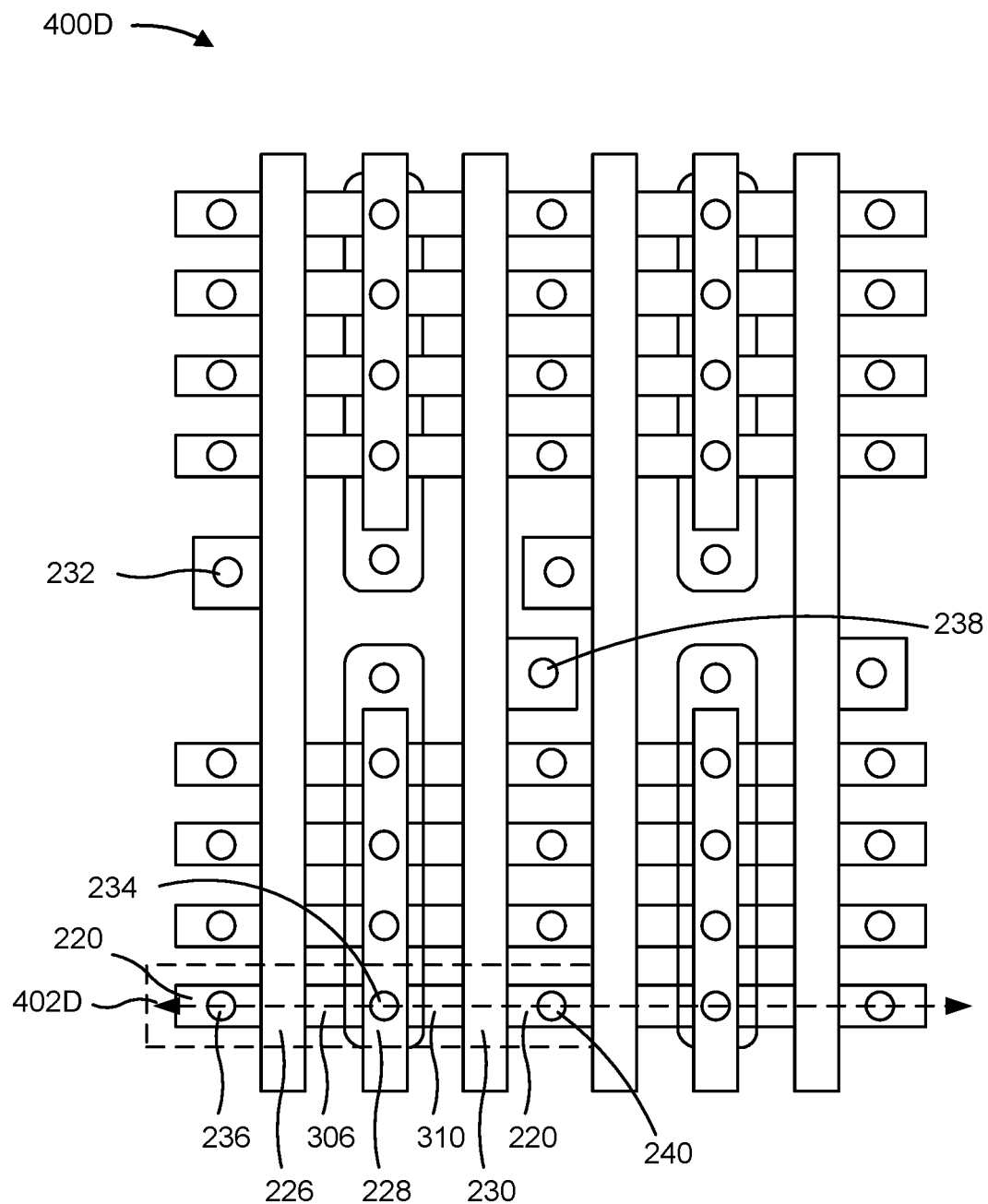

As shown in FIG. 4D, the semiconductor device 400D may include a first set of transistors coupled to a second set of transistors. The first set of transistors include a multi-state transistor 402D. The multi-state transistor 402D may include one or more components of the semiconductor device 200 shown in FIG. 3. In some implementations, the first terminal 232 may be common with the first set of transistors and the second set of transistors. In some implementations, the fourth terminal 238 may be common with the first set of transistors and the second set of transistors and may not be common between adjacent transistors.

As indicated above, FIGS. 4A-4D are provided as examples. Other examples may differ from what is described with regard to FIGS. 4A-4D.

FIG. 5 is a diagram of example components of a device 500, which may correspond to deposition tool 102, etching tool 104, CMP tool 106, ionizing tool 108, and/or wafer/die transport tool 110. In some implementations, deposition tool 102, etching tool 104, CMP tool 106, ionizing tool 108, and/or wafer/die transport tool 110 may include one or more devices 500 and/or one or more components of device 500. As shown in FIG. 5, device 500 may include a bus 510, a processor 520, a memory 530, a storage component 540, an input component 550, an output component 560, and a communication component 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, and/or an actuator. Output component 560 enables device 500 to provide output, such as via a display, a speaker, and/or one or more light-emitting diodes. Communication component 570 enables device 500 to communicate with other devices, such as via a wired connection and/or a wireless connection. For example, communication component 570 may include a receiver, a transmitter, a transceiver, a modem, a network interface card, and/or an antenna.

Device 500 may perform one or more processes described herein. For example, a non-transitory computer-readable medium (e.g., memory 530 and/or storage component 540) may store a set of instructions (e.g., one or more instructions, code, software code, and/or program code) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

FIG. 6 is a flowchart of an example process of manufacturing a semiconductor device. In some implementations, one or more process blocks of FIG. 6 may be performed by one or more semiconductor processing tools (e.g., one or more of deposition tool 102, etching tool 104, CMP tool 106, ionizing tool 108, and/or wafer/die transport tool 110). Additionally, or alternatively, one or more process blocks of FIG. 6 may be performed by one or more components of device 500, such as processor 520, memory 530, storage component 540, input component 550, output component 560, and/or communication component 570.

As shown in FIG. 6, process 600 may include depositing a first dielectric layer on a substrate of a semiconductor device (block 610). For example, the one or more semiconductor processing tools may deposit a first dielectric layer 212 on a substrate 202 of a semiconductor device 200, as described above.

As further shown in FIG. 6, process 600 may include depositing a first gate (e.g., a floating gate) on the first dielectric layer (block 620). For example, the one or more semiconductor processing tools may deposit a first floating gate 214 on the first dielectric layer 212, as described above.

As further shown in FIG. 6, process 600 may include depositing a second dielectric layer on the first gate and on the substrate of the semiconductor device (block 630). For example, the one or more semiconductor processing tools may deposit a second dielectric layer 222 on the floating gate 214 and on the substrate 202 of the semiconductor device 200, as described above.

As further shown in FIG. 6, process 600 may include depositing a second gate on a first portion of the second dielectric layer, wherein a third portion of the second dielectric layer is between the first control gate and the floating gate and between the second control gate and the floating gate (block 640). For example, the one or more semiconductor processing tools may deposit a first control gate 226 on a first portion 302 of the second dielectric layer 222, as described above. In some implementations, a third portion 306 of the second dielectric layer 222 is between the first control gate 226 and the floating gate 214 and between the second control gate 228 and the floating gate 214.

Process 600 may include additional implementations, such as any single implementation or any combination of implementations described below and/or in connection with one or more other processes described elsewhere herein.

In a first implementation, process 600 includes depositing, after depositing the first gate on the first dielectric layer, a photoresist on the first gate and a first portion of the substrate of the semiconductor device, forming a first source or drain for the semiconductor device on a second portion of the substrate of the semiconductor device, and forming a second source or drain for the semiconductor device on a third portion of the substrate of the semiconductor device.

In a second implementation, alone or in combination with the first implementation, forming the first source or drain and forming the second source or drain comprises ionizing the second portion of the substrate of the semiconductor device and the third portion of the substrate of the semiconductor device.

In a third implementation, alone or in combination with one or more of the first and second implementations, process 600 includes etching, after depositing the second gate, the second dielectric layer from the second portion of the substrate of the semiconductor device.

In a fourth implementation, alone or in combination with one or more of the first through third implementations, process 600 includes forming a first terminal on the second gate, forming a second terminal on a third gate, and forming a third terminal on the second portion of the substrate of the semiconductor device.

In a fifth implementation, alone or in combination with one or more of the first through fourth implementations, depositing the second dielectric layer comprises depositing a first oxide layer, depositing a nitride layer on the first oxide layer, and depositing a second oxide layer on the nitride layer.

In a sixth implementation, alone or in combination with one or more of the first through fifth implementations, depositing the second gate comprises depositing control gate material on the second dielectric layer, and performing plasma etching on the control gate material to form the second gate.

In a seventh implementation, alone or in combination with one or more of the first through sixth implementations, process 600 includes forming a third dielectric layer on the substrate of the semiconductor device, forming a third gate on the third dielectric layer, and forming a fourth gate on a third portion of the second dielectric layer, wherein a fourth portion of the second dielectric layer is formed between the third gate and the fourth gate.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

FIG. 7 is a flowchart of an example process of manufacturing a semiconductor device. In some implementations, one or more process blocks of FIG. 7 may be performed by one or more semiconductor processing tools (e.g., one or more of deposition tool 102, etching tool 104, CMP tool 106, ionizing tool 108, and/or wafer/die transport tool 110). Additionally, or alternatively, one or more process blocks of FIG. 7 may be performed by one or more components of device 500, such as processor 520, memory 530, storage component 540, input component 550, output component 560, and/or communication component 570.

As shown in FIG. 7, process 700 may include depositing a first dielectric layer on a substrate of a semiconductor device (block 710). For example, the one or more semiconductor processing tools may deposit a first dielectric layer 212 on a substrate 202 of a semiconductor device 200, as described above.

As further shown in FIG. 7, process 700 may include depositing a first floating gate on a first portion of the first dielectric layer (block 720). For example, the one or more semiconductor processing tools may deposit a first floating gate 214 on a first portion of the first dielectric layer 212, as described above.

As further shown in FIG. 7, process 700 may include depositing a second floating gate on a second portion of the first dielectric layer (block 730). For example, the one or more semiconductor processing tools may deposit a second floating gate 216 on a second portion of the first dielectric layer 212, as described above.

As further shown in FIG. 7, process 700 may include depositing a second dielectric layer on the first floating gate, on the second floating gate, and on the substrate of the semiconductor device (block 740). For example, the one or more semiconductor processing tools may deposit a second dielectric layer 222 on the first floating gate 214, on the second floating gate 216, and on the substrate 202 of the semiconductor device 200, as described above.

As further shown in FIG. 7, process 700 may include depositing a first control gate on a first portion of the second dielectric layer (block 750). For example, the one or more semiconductor processing tools may deposit a first control gate 226 on a first portion 302 of the second dielectric layer 222, as described above.

As further shown in FIG. 7, process 700 may include depositing a second control gate on a second portion of the second dielectric layer (block 760). For example, the one or more semiconductor processing tools may deposit a second control gate 228 on a second portion 304 of the second dielectric layer 222, as described above.

As further shown in FIG. 7, process 700 may include depositing a third control gate on a third portion of the second dielectric layer, wherein a fourth portion of the second dielectric layer is between the first control gate and the first floating gate and between the second control gate and the first floating gate, and wherein a fifth portion of the second dielectric layer is between the third control gate and the second floating gate and between the second control gate and the second floating gate (block 770). For example, the one or more semiconductor processing tools may deposit a third control gate 230 on a third portion (e.g., fourth portion 308) of the second dielectric layer 222, as described above. In some implementations, a fourth portion (e.g., third portion 306) of the second dielectric layer 222 is between the first control gate 226 and the first floating gate 214 and between the second control gate 228 and the first floating gate 214, and wherein a fifth portion 310 of the second dielectric layer 222 is between the third control gate 230 and the second floating gate 216 and between the second control gate 228 and the second floating gate 216.

Process 700 may include additional implementations, such as any single implementation or any combination of implementations described below and/or in connection with one or more other processes described elsewhere herein.

In a first implementation, process 700 includes forming, after depositing the first floating gate on the first portion of the first dielectric layer and after depositing the second floating gate on the second portion of the first dielectric layer, one or more of a first source or drain for the semiconductor device on a third portion of the substrate that is laterally displaced from the first control gate, a second source or drain for the semiconductor device on a fourth portion of the substrate that is below the second control gate, or a third source or drain for the semiconductor device on a fifth portion of the substrate that is laterally displaced from the third control gate.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Based on the first control gate, the second control gate, and the first floating gate being arranged laterally (e.g., instead of being arranged in a stacked configuration), the first control gate and the second control gate may be displaced from an electrode and/or a terminal that is coupled to a source/drain of the semiconductor device, which may reduce defects in a manufacturing process. Additionally, a process for manufacturing the semiconductor device may include operations for forming gates that include depositing polysilicon material 2 times, applying photoresist 1 time, and performing etching on the polysilicon material 2 times to form a floating gate, a first control gate, and a second control gate, which may provide a reduction in manufacturing time and/or manufacturing cost among other improvements.

As described in greater detail above, some implementations described herein provide a semiconductor device. The semiconductor device includes a first dielectric layer formed on a substrate of the semiconductor device. The semiconductor device includes a floating gate formed on the first dielectric layer. The semiconductor device includes a second dielectric layer on the floating gate and on the substrate of the semiconductor device. The semiconductor device includes a first control gate formed on a first portion of the second dielectric layer. The semiconductor device includes a second control gate formed on a second portion of the second dielectric layer, where a third portion of the second dielectric layer is between the first control gate and the floating gate and between the second control gate and the floating gate.

As described in greater detail above, some implementations described herein provide a method for manufacturing a semiconductor device. The method includes depositing a first dielectric layer on a substrate of a semiconductor device. The method includes depositing a first gate on the first dielectric layer. The method includes depositing a second dielectric layer on the first gate and on the substrate of the semiconductor device. The method includes depositing a second gate on a first portion of the second dielectric layer, where a second portion of the second dielectric layer is between the first gate and the second gate.

As described in greater detail above, some implementations described herein provide a method for manufacturing a semiconductor device. The method includes depositing a first dielectric layer on a substrate of a semiconductor device. The method includes depositing a floating gate on a first portion of the first dielectric layer. The method includes depositing a second floating gate on a second portion of the first dielectric layer. The method includes depositing a second dielectric layer on the floating gate, on the second floating gate, and on the substrate of the semiconductor device. The method includes depositing a first control gate on a first portion of the second dielectric layer. The method includes depositing a second control gate on a second portion of the second dielectric layer. The method includes depositing a third control gate on a third portion of the second dielectric layer, where a fourth portion of the second dielectric layer is between the first control gate and the floating gate and between the second control gate and the floating gate, and where a fifth portion of the second dielectric layer is between the third control gate and the second floating gate and between the second control gate and the second floating gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first dielectric layer on a substrate of the semiconductor device;
   a first floating gate and a second floating gate that are each formed on the first dielectric layer;
   a second dielectric layer directly on the first floating gate and on the substrate of the semiconductor device, wherein the second dielectric layer extends outwardly from the first floating gate and the second floating gate; and
   a first control gate formed on the second dielectric layer and between the first floating gate and the second floating gate,
   wherein, in a plan view of the semiconductor device, the first control gate is not over any portion of the first floating gate and the second floating gate.

2. The semiconductor device of claim 1, wherein the second dielectric layer comprises:
   a first oxide layer,
   a nitride layer on the first oxide layer, and
   a second oxide layer on the nitride layer.

3. The semiconductor device of claim 1, further comprising:
   a second control gate over the second dielectric layer;
   a first portion of the substrate of the semiconductor device configured as a first source or drain for the semiconductor device; and
   a second portion of the substrate of the semiconductor device configured as a second source or drain for the semiconductor device.

4. The semiconductor device of claim 3, wherein the semiconductor device is configured to perform a programming operation based on at least one of:
   application of a first voltage to the first control gate,
   application of a second voltage, that is greater than the first voltage, to the second control gate, or
   application of a third voltage, that is less than the first voltage, to the first portion of the substrate.

5. The semiconductor device of claim 3, wherein the semiconductor device is configured to perform an erasing operation based on at least one of:
   application of a first voltage to the first control gate,
   application of a second voltage, that is less than the first voltage, to the second control gate, or
   application of a third voltage, that is greater than the first voltage, to the first portion of the substrate.

6. The semiconductor device of claim 1, further comprising:
   a second control gate over the second dielectric layer;
   a third dielectric layer on the substrate of the semiconductor device;
   an additional floating gate on the third dielectric layer; and
   a third control gate on a third portion of the second dielectric layer,
   wherein a fourth portion of the second dielectric layer is between the second control gate and the additional floating gate and between the additional floating gate and the third control gate.

7. The semiconductor device of claim 6, further comprising:
   a third portion of the substrate of the semiconductor device configured as a source or drain for the semiconductor device.

8. The semiconductor device of claim 7, wherein the semiconductor device is configured to perform a programming operation based on at least one of:
   application of a first voltage to the third control gate,
   application of a second voltage, that is greater than the first voltage, to the second control gate, or
   application of a third voltage, that is less than the first voltage, to the third portion of the substrate.

9. The semiconductor device of claim 7, wherein the semiconductor device is configured to perform an erasing operation based on at least one of:
   application of a first voltage to the third control gate,
   application of a second voltage, that is less than the first voltage, to the second control gate, or
   application of a third voltage, that is greater than the first voltage, to the third portion of the substrate.

10. The semiconductor device of claim 7, wherein the semiconductor device has a first state associated with the first control gate, the second control gate, and a first portion of the substrate, and
wherein the semiconductor device has a second state associated with the third control gate, the second control gate, and the third portion of the substrate of the semiconductor device.

11. A method, comprising:
depositing a first dielectric layer on a substrate of a semiconductor device;
forming a first gate on the first dielectric layer;
forming a second gate on the first dielectric layer;
depositing a second dielectric layer directly on the first gate and on the substrate of the semiconductor device, wherein the second dielectric layer extends outwardly from the first gate and the second gate; and
forming a third gate on the second dielectric layer,
wherein, in a plan view of the semiconductor device, the third gate is not formed over any portion of the first gate and the second gate.

12. The method of claim 11, further comprising:
depositing, after forming the first gate on the first dielectric layer, a photoresist on the first gate and a first portion of the substrate of the semiconductor device;
forming a first source or drain for the semiconductor device on a second portion of the substrate of the semiconductor device; and
forming a second source or drain for the semiconductor device on a third portion of the substrate of the semiconductor device.

13. The method of claim 12, wherein forming the first source or drain and forming the second source or drain comprises:
ionizing the second portion of the substrate of the semiconductor device and the third portion of the substrate of the semiconductor device.

14. The method of claim 12, wherein forming the second gate comprises:
depositing control gate material on the second dielectric layer; and
etching, after depositing the second gate, the second dielectric layer from the second portion of the substrate of the semiconductor device to form the second gate.

15. The method of claim 12, further comprising:
forming a first terminal on the second gate;
forming a second terminal on a third gate; and
forming a third terminal on the second portion of the substrate of the semiconductor device.

16. The method of claim 11, wherein depositing the second dielectric layer comprises:
depositing a first oxide layer,
depositing a nitride layer on the first oxide layer, and
depositing a second oxide layer on the nitride layer.

17. The method of claim 11, wherein forming the second gate comprises:
depositing control gate material on the second dielectric layer; and
performing plasma etching on the control gate material to form the second gate.

18. The method of claim 11, further comprising:
forming a third dielectric layer on the substrate of the semiconductor device;
forming a third gate on the third dielectric layer; and
forming a fourth gate on a second portion of the second dielectric layer.

19. A method, comprising:
depositing a first dielectric layer on a substrate of a semiconductor device;
forming a first floating gate on a first portion of the first dielectric layer;
forming a second floating gate on a second portion of the first dielectric layer;
depositing a second dielectric layer directly on the first floating gate, on the second floating gate, and on the substrate of the semiconductor device, wherein the second dielectric layer extends outwardly from the first floating gate and the second floating gate; and
forming a first control gate on the second dielectric layer and between the first floating gate and the second floating gate,
wherein, in a plan view of the semiconductor device, first control gate is not formed over any portion of the first floating gate and the second floating gate.

20. The method of claim 19, further comprising:
forming a second control gate on the second dielectric layer;
forming a third control gate on the second dielectric layer; and
forming, after forming the first floating gate on the first dielectric layer and after forming the second floating gate on the second portion of the first dielectric layer, one or more of:
a first source or drain for the semiconductor device on a third portion of the substrate that is laterally displaced from the first control gate;
a second source or drain for the semiconductor device on a fourth portion of the substrate that is below the second control gate; or
a third source or drain for the semiconductor device on a fifth portion of the substrate that is laterally displaced from the third control gate.

* * * * *